United States Patent
Yamada et al.

(10) Patent No.: US 8,673,193 B2
(45) Date of Patent: Mar. 18, 2014

(54) ROLLER NANOIMPRINT APPARATUS, MOLD ROLLER FOR USE IN ROLLER NANOIMPRINT APPARATUS, FIXING ROLLER FOR USE IN ROLLER NANOIMPRINT APPARATUS, AND PRODUCTION METHOD OF NANOIMPRINT SHEET

(75) Inventors: Nobuaki Yamada, Osaka (JP); Akiyoshi Fujii, Osaka (JP); Hidekazu Hayashi, Osaka (JP); Tokio Taguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 810 days.

(21) Appl. No.: 12/734,381

(22) PCT Filed: Nov. 19, 2008

(86) PCT No.: PCT/JP2008/071030
§ 371 (c)(1),
(2), (4) Date: Apr. 28, 2010

(87) PCT Pub. No.: WO2009/107294
PCT Pub. Date: Sep. 3, 2009

(65) Prior Publication Data
US 2010/0258978 A1  Oct. 14, 2010

(30) Foreign Application Priority Data
Feb. 27, 2008  (JP) .................. 2008-046667

(51) Int. Cl.
*B29C 39/14* (2006.01)
(52) U.S. Cl.
USPC ........... 264/214; 264/314; 425/186; 425/194; 425/224; 425/368; 425/471
(58) Field of Classification Search
USPC .......... 264/214, 314, 315; 425/186, 194, 368, 425/471
See application file for complete search history.

(56) References Cited

U.S. PATENT DOCUMENTS 2,331,743 A   5/1942   Sullivan
2,849,192 A   10/1955  Fairchild
(Continued)

FOREIGN PATENT DOCUMENTS

EP   0481753     10/1991
EP   1 473 594   11/2004
(Continued)

OTHER PUBLICATIONS

USPTO Office Action dated Oct. 18, 2010 for U.S. Appl. No. 12/801,915.

*Primary Examiner* — Ryan Ochylski
(74) *Attorney, Agent, or Firm* — Harness, Dickey & Pierce, P.L.C.

(57) ABSTRACT

A roller nanoimprint apparatus is disclosed which is capable of preventing a workpiece film with nanostructures having been transferred from the mold roller from being uneven in thickness and allowing easy replacement of the mold roller. At least one embodiment of the present invention is directed to a roller nanoimprint apparatus including a mold roller and continuously transferring nanosized protrusions to a surface of a workpiece film by rotating the mold roller, wherein the mold roller is a cylindrical body having an outer circumference surface with nanosized recesses formed thereon, the roller nanoimprint apparatus further includes a fluid container having an elastic film inflatable by injecting fluid into the container, the fluid container being arranged in a region defined by an inner circumference surface of the mold roller, the mold roller is mounted or demounted when the elastic film is shrunken, and the mold roller is supported from the inside when the elastic film is inflated.

6 Claims, 7 Drawing Sheets

(56) References Cited

U.S. PATENT DOCUMENTS

| | | | |
|---|---|---|---|
| 3,543,366 A * | 12/1970 | Collet | 492/4 |
| 4,913,051 A * | 4/1990 | Molinatto | 101/376 |
| 5,249,949 A | 10/1993 | Aslam et al. | |
| 5,507,228 A * | 4/1996 | Schulz | 101/375 |
| 5,811,137 A | 9/1998 | Clark et al. | |
| 6,077,065 A * | 6/2000 | Sumiyoshi et al. | 425/368 |
| 6,089,848 A | 7/2000 | Stefani | |
| 6,173,496 B1 | 1/2001 | Makoui et al. | |
| 6,568,931 B2 | 5/2003 | Fujii et al. | |
| 2002/0044356 A1 | 4/2002 | Arakawa | |
| 2003/0205475 A1 | 11/2003 | Sawitowski | |
| 2003/0234484 A1* | 12/2003 | Guddanti et al. | 271/109 |
| 2004/0159977 A1 | 8/2004 | Perfetto et al. | |
| 2004/0163441 A1 | 8/2004 | Sawitowski | |
| 2004/0219249 A1 | 11/2004 | Chung et al. | |
| 2005/0104253 A1 | 5/2005 | Katsumoto | |
| 2006/0050387 A1 | 3/2006 | Arakawa | |
| 2007/0018345 A1* | 1/2007 | Chao et al. | 264/1.1 |
| 2007/0159698 A1 | 7/2007 | Taguchi | |
| 2008/0032058 A1 | 2/2008 | Arakawa | |
| 2009/0211912 A1 | 8/2009 | Taguchi | |
| 2009/0252825 A1 | 10/2009 | Taguchi | |

FOREIGN PATENT DOCUMENTS

| | | |
|---|---|---|
| JP | 5-016230 | 1/1993 |
| JP | 2001-264520 | 9/2001 |
| JP | 2002-079535 | 3/2002 |
| JP | 2003-043203 | 2/2003 |
| JP | 2003-531962 | 10/2003 |
| JP | 2004-223724 | 8/2004 |
| JP | 2005-144698 | 6/2005 |
| JP | 2005-156695 | 6/2005 |
| JP | 2005-161531 | 6/2005 |
| JP | 2007-086283 | 4/2007 |
| JP | 2007-203576 | 8/2007 |
| JP | 2007-281099 | 10/2007 |
| JP | 4265729 | 5/2009 |
| JP | 4265816 | 5/2009 |
| JP | 4368384 | 11/2009 |
| JP | 4420967 | 2/2010 |
| WO | WO 2006/043244 A1 | 4/2006 |
| WO | WO 2006/059686 | 6/2006 |
| WO | WO 2007/064803 | 6/2007 |

* cited by examiner

ROLLER NANOIMPRINT APPARATUS, MOLD ROLLER FOR USE IN ROLLER NANOIMPRINT APPARATUS, FIXING ROLLER FOR USE IN ROLLER NANOIMPRINT APPARATUS, AND PRODUCTION METHOD OF NANOIMPRINT SHEET

TECHNICAL FIELD

The present invention is directed to roller nanoimprint apparatuses, mold rollers for use in a roller nanoimprint apparatus, fixing rollers for use in a roller nanoimprint apparatus, and production methods of a nanoimprint sheet. More particularly, the present invention is directed to a roller nanoimprint apparatus, a mold roller for use in a roller nanoimprint apparatus, a fixing roller for use in a roller nanoimprint apparatus, and a production method of a nanoimprint sheet, suitable for producing resin sheets with a low reflective surface.

BACKGROUND ART

Nanoimprint technology in which a resin material formed on a substrate is embossed with an undulated pattern in nanometer size (1 to 1000 µm) (hereinafter, also referred to as "nanostructure(s)") of a mold by pressing the two together has attracted attention recently. Applications of nanoimprint technology to optical materials, finer ICs, substrates for clinical laboratory test, and the like are now being developed and researched. Nanoimprint technology advantageously allows a component with a variety of characteristics to be produced at low costs as compared with conventional pattern-forming processes involving lithography and etching. This is because nanoimprinters have a simple configuration and are not so expensive than conventional apparatuses and further because it takes a short time to mass-produce components with the same shape.

Thermal nanoimprint and UV nanoimprint are known as nanoimprint technology. According to UV nanoimprint, for example, a mold with nanostructures is pressed against a UV-curable resin film formed on a transparent substrate, and the film is irradiated with UV ray, thereby producing a thin film with nanostructures in the inverse shape of the mold on the transparent substrate. Flat molds and batch process are commonly employed in UV nanoimprint, although it is still studied.

In order to mass-produce thin films with nanostructures at low costs by nanoimprint technology, roll-to-roll process is preferable to batch process. Roll-to-roll process allows continuous production of the thin film with nanostructures.

With respect to nanoimprint technology involving roll-to-roll process, for example, Patent Document 1 discloses that a pattern of a mold roller 52 is transferred onto a UV-curable resin coated on a mold roller 51 larger than the mold roller 52 while the pattern is extended by sequentially moving the mold roller 52 laterally as shown in FIG. 18. However, in this method, the mold roller 52 is moved, and so, the resulting film has a seam in the pattern. Thus this method is not suitably used for forming a nanopattern with a width larger than the width of the mold roller 52.

With respect to rollers used in roll-to-roll process in technologies other than nanoimprint technology, for example, Patent Documents 2 and 3 disclose a method of producing a roller with an undulated pattern directly formed thereon. When this method is applied to nanoimprint technology, however, a mold roller with nanostructures needs to be equipped with, for example, a bearing mechanism for coupling the mold roller with a nanoimprinter. This leads to an increase in costs on the mold roller, which is a problem in view of mass-production.

Further, for example, Patent Document 4 discloses, in FIG. 7, a method of attaching a cylindrical member with an undulated pattern to a roller. According to this method, however, it is difficult to form a continuous nanopattern by bending the member around the outer circumference of the roller, and as a result, the mold roller has a seam in the nanopattern.

In view of this, for example, Patent Documents 5 to 8 disclose, in a technology of producing optical materials with nanostructures, a method of using an aluminum substrate having a surface with nanosized cavities formed thereon by anodizing. In optical materials, "moth-eye structure(s)" is known as one type of the nanostructures. The moth-eye structures include, for example, conical protrusions in nanometer size formed on a transparent substrate surface. According to optical materials with the moth-eye structures, a reflected light amount can be dramatically decreased because a refractive index continuously changes from an air layer to a transparent substrate and so incident light does not recognize the air layer-transparent substrate interface as an optical surface.

According to this method involving anodizing, for example, as disclosed in FIG. 19 of Patent Document 8, nanosized recesses can be formed in a random placement and in a uniform distribution, and seamless nanostructures needed for continuous production can be formed on a columnar or cylindrical mold roller surface.

[Patent Document 1]
  Japanese Kokai Publication No. 2007-203576
[Patent Document 2]
  Japanese Kokai Publication No. 2005-144698
[Patent Document 3]
  Japanese Kokai Publication No. 2005-161531
[Patent Document 4]
  Japanese Kokai Publication No. 2007-281099
[Patent Document 5]
  Japanese Kohyo Publication No. 2003-531962
[Patent Document 6]
  Japanese Kokai Publication No. 2003-43203
[Patent Document 7]
  Japanese Kokai Publication No. 2005-156695
[Patent Document 8]
  WO 2006/059686
[Patent Document 9]
  Japanese Kokai Publication No. 2001-264520

DISCLOSURE OF INVENTION

Mold rollers in nanoimprinters can not be permanently used and need to be replaced after being used for a certain period. So the mold rollers are strongly desired to be not expensive. Cylindrical mold rollers having a simple structure are effectively used as such replaceable mold rollers. In addition, the mold roller needs to impart the nanostructures while applying a uniform pressure to a workpiece film surface in order to prevent the resulting film from being uneven in thickness. When a cylindrical mold roller is used, needed is a method of mounting the cylindrical mold roller on a nanoimprint apparatus with high accuracy control of position and direction of the mold roller. According to mounting mechanisms, e.g., screws such as a bolt, fastening jigs such as a sprocket, and a spacer, it is difficult to mount the mold roller on a nanoimprint apparatus in an easy replaceable manner and with high accuracy control of the position and direction of the roller.

The present invention has been made in view of the above-mentioned state of the art. The present invention has an object to provide a roller nanoimprint apparatus, a mold roller for use in a roller nanoimprint apparatus, a fixing roller for use in a roller nanoimprint apparatus, and a production method of a nanoimprint sheet, in which the resulting film with nanostructures which have been transferred from the mold roller are prevented from being uneven in thickness.

The present inventors made various investigations on a roller nanoimprint apparatus including a cylindrical mold roller, and noted a way of mounting the mold roller on the nanoimprint apparatus. Further, the inventors found the followings. An elastic film inflatable by fluid is used, and the mold roller is mounted or demounted when the elastic film is shrunken, and the mold roller is supported from the inside when the elastic film is inflated. According to this, the resulting film with nanostructures having been transferred from the mold roller can be prevented from being uneven in thickness, and the mold roller can be easily replaced. As a result, the above-mentioned problems have been admirably solved, leading to completion of the present invention.

The present invention is a roller nanoimprint apparatus including a mold roller and continuously transferring nanosized protrusions to a surface of a workpiece film by rotating the mold roller, wherein the mold roller is a cylindrical body having an outer circumference surface with nanosized recesses formed thereon, the roller nanoimprint apparatus further includes a fluid container having an elastic film inflatable by injecting fluid into the container, the fluid container being arranged in a region defined by an inner circumference surface of the mold roller, the mold roller is mounted or demounted when the elastic film is shrunken, and the mold roller is supported from the inside when the elastic film is inflated (hereinafter, also referred to as a "first nanoimprinter of the present invention").

In the present invention, by rotating the cylindrical mold roller an outer circumference surface of which has nanosized recesses formed thereon, embossment to a workpiece film and separation from the film can be continuously performed. As a result, a product having a surface with nanosized protrusions formed thereon can be mass-produced at fast speeds. Further, by rotating the cylindrical mold roller, the resulting film can be provided with seamless surface shape.

The workpiece film is not especially limited as long as nanosized protrusions in the inverse shape of the nanosized recesses formed on the outer circumference surface of the mold roller can be formed on the workpiece film by embossment. For example, a sheet resin is preferably used as the film. In embossment to resins, it is preferable that an uncured or half-cured resin is embossed with the mold pattern and then provided with curing treatment.

In the present description, the nanosized recesses are intended to refer to recesses each having a depth of 1 nm or larger and smaller than 1 μm (=1000 nm), and the nanosized protrusions are intended to refer to protrusions each having a height of 1 nm or larger and smaller than 1 μm (=1000 nm). In the present description, the shaped structures, i.e., nanosized recesses and nanosized protrusions are also referred to as nanostructure(s). Examples of the nanostructures include moth-eye structures and wire grid structures.

The first nanoimprinter of the present invention includes a fluid container in a region defined by an inner circumference surface of the mold roller, the fluid container having an elastic film inflatable by injecting fluid into the container. The fluid container is not especially limited as long as it has a structure allowing the elastic film to be inflated by fluid injected thereinto. For example, the fluid container may be a bag-like elastic film or a rigid container with an opening sealed with an elastic film. Use of such a fluid container allows the mold roller to be mounted or demounted when the elastic film is shrunken and to be held from the inside when the elastic film is inflated. Further, by applying fluid pressure uniformly to the inner circumference surface of the mold roller, the mold roller can be supported, and as a result, a workpiece film having a uniform thickness can be obtained. The elastic film is shrunken by discharging the fluid from the fluid container, and the mold roller can be mounted or demounted. This allows easy replacement of the mold roller.

The first roller nanoimprint apparatus of the present invention is not especially limited and may include other components as long as it includes the mold roller and the fluid container.

According to preferable embodiments of the first nanoimprinter of the present invention, (1) the first imprinter includes a hollow roller removably mounted thereon in the region defined by the inner circumference surface of the mold roller, the hollow roller having an opening, wherein the elastic film is a bag-like elastic film, the fluid container is an elastic bag composed of the elastic film, the elastic bag is arranged inside the hollow roller, the mold roller is supported by inflating the elastic bag, thereby bringing a portion of the elastic bag, protruded from the opening of the hollow roller by the inflation, into contact with the inner circumference surface of the mold roller, and when thus-supported, the mold roller is rotated by rotating the hollow roller;

(2) the fluid container is removably mounted thereon and seals an opening of a hollow roller with the elastic film, the mold roller is supported by inflating the elastic film, thereby bringing the elastic film into contact with the inner circumference surface of the mold roller, and when thus-supported, the mold roller is rotated by rotating the hollow roller; and (3) the first nanoimprinter includes a rotor removably mounted thereon in the region defined by the inner circumference surface of the mold roller, wherein the elastic film is a bag-like elastic film, the fluid container is an elastic bag composed of the elastic film and is mounted around the rotor, the mold roller is supported by inflating the elastic film, thereby bringing the elastic film into contact with the inner circumference surface of the mold roller, and when thus-supported, the mold roller is rotated by rotating the rotor.

In the embodiments (1) and (2), according to a preferable embodiment of the hollow roller, an elastic body is arranged on a surface of the hollow roller facing the inner circumference surface of the mold roller, except for in the opening. According to this embodiment, if the mold roller contacts the hollow roller, the elastic body functions as a buffer to prevent the resulting film from being uneven in thickness and protect the hollow roller and the mold roller against damages.

It is preferable that the hollow roller has a plurality of the openings in order to stably support the mold roller. The openings preferably are substantially the same in size and also preferably substantially uniformly spaced.

In the embodiment (3), according to a preferable embodiment of the rotor, an elastic body is arranged on an outer circumference surface of the rotor in an elastic bag-free region. According to this embodiment, even if the mold roller contacts the rotor, the elastic body functions as a buffer to prevent the resulting film from being uneven in thickness and protect the rotor and the mold roller against damages.

According to a preferable embodiment of the mold roller, the mold roller substantially has no seam. According to this embodiment, the mold roller has a seamless pattern of the nanosized recesses on its outer circumference surface. This allows the workpiece film to have a substantially seamless pattern of the nanosized protrusions. For example, a display device including this film as an ultra-low reflection film can prevent occurring of uneven display. The term "seamless" (the phrase "substantially has no seam") is intended to refer to a state where a seam can not be optically observed. It is preferable that the outer circumference surface of the mold roller has a difference in surface height, which is linearly formed, of 0.6 μm or smaller. It is also preferable that a pattern-free linear region with larger than 0.6 μm in width is not formed on the outer circumference surface of the mold roller. The mold roller with the substantially seamless pattern can be obtained by directly forming a mold pattern on an outer circumference surface of a cylindrical roller member. In contrast, when a plate member with a previously formed mold pattern is bended to joint the both ends thereof to each other, the resulting mold roller has a seam portion.

According to a preferable embodiment of the mold roller, the mold roller is an aluminum tube having the nanosized recesses formed on a polished outer circumference surface thereof by anodization. According to this embodiment, the mold roller with substantially no seam can be obtained, and the above-mentioned advantages can be obtained. The polishing is preferably performed, by cut-polishing. As a way of cut-polishing the aluminum tube surface, an aluminum tube is continuously cut-polished with a tool bit made of diamond while being rotated by moving the tool in a direction of a rotation axis of the tube. The mold roller obtained from the thus-polished aluminum tube has a surface with a linear scar. The linear scar is small enough not to be observed with the naked eye, and it can be determined by observing the surface with scanning election microscope (SEM). According to anodization, nanosized conical recesses can be formed on the outer circumference surface of the aluminum tube. Such recesses can be exclusively formed by use of anodization. By chemical oxidization, an oxide film with a flat surface is formed.

The present invention is also directed to a mold roller preferably used in the first nanoimprinter of the present invention.

A first mold roller of the present invention is a mold roller for use in a roller nanoimprint apparatus, for continuously transferring nanosized protrusions to a surface of a workpiece film surface by embossing to the workpiece film surface while being rotated, wherein the mold roller is a cylindrical body having an outer circumference surface with nanosized recesses formed thereon, and the mold roller includes a positioning mechanism for positioning the mold roller with a member arranged in a region defined by an inner circumference surface of the mold roller. Examples of the positioning mechanism include an engagement structure and a hook. According to the first mold roller of the present invention, the positioning mechanism positions the mold roller. This allows easy mounting or demounting of the mold roller and prevents sliding and misalignment of the mold roller at the time of the embossing.

A second mold roller of the present invention is a mold roller for use in a roller nanoimprint apparatus, for continuously transferring nanosized protrusions to a surface of a workpiece film by embossing to the workpiece film surface while being rotated, wherein the mold roller is prepared by cut-polishing an outer circumference surface of a cylindrical aluminum tube formed by extruding, and alternately repeating etching and anodization for the cut-polished outer circumference surface, thereby forming conical recesses with a depth smaller than a wavelength of visible light on the outer circumference of the mold roller. Extrusion is preferably employed for producing the cylindrical aluminum tube, but the thus-produced aluminum tube might have a rough surface, and the roughness might be in a size larger than nanometer size. In contrast, by cut-polishing an aluminum tube surface prior to the anodization, the surface flatness of the aluminum tube can be ensured after the anodization. This can prevent the resulting film from having a roughness in a size larger than nanometer size, and so a phenomenon in which white blur on the film surface, caused by scattering of ambient light, can be suppressed. For example, a display device including this film as an ultra-low reflection film can prevent occurring of uneven display. When cut-polishing is employed, the aluminum tube surface possibly has a striation along the circumferential direction. When extrusion is employed, the surface possibly has a striation along the stretching direction of the tube. Thus, the striation by cut-polishing and that by extrusion can be distinguished. Further, processes are rarely subjected to the inner circumference surface of the tube, and a striation by extrusion tends to remain on the inner circumference surface of the tube.

The present invention is also directed to a fixing roller preferably used in the first nanoimprinter of the present invention.

A first fixing roller of the present invention is a fixing roller for use in a roller nanoimprint apparatus, for continuously transferring nanosized protrusions to a surface of a workpiece film by rotating a cylindrical mold roller having nanosized recesses formed on an outer circumference surface thereof, wherein the fixing roller is arranged in a region (inside the mold roller) defined by an inner circumference surface of the mold roller, the fixing roller includes an elastic film inflatable by fluid injection, the mold roller is mounted or demounted when the elastic film is shrunken, and the mold roller is rotated by rotating the fixing roller when the mold roller is supported from the inside by inflating the elastic film, and the fixing roller includes a positioning mechanism for positioning the fixing roller with the mold roller. Examples of the positioning mechanism include an engagement structure and a hook. According to the first fixing roller of the present invention, the mold roller can be positioned due to the positioning mechanism. This allows easy mounting and demounting of the mold roller, and prevents sliding and misalignment of the mold roller at the time of the embossing.

A second fixing roller of the present invention is a fixing roller for use in a roller nanoimprint apparatus, for continuously transferring nanosized protrusions to a surface of a workpiece film by rotating a cylindrical mold roller having nanosized recesses formed on an outer circumference surface thereof, wherein the fixing roller is arranged in a region defined by an inner circumference surface of the mold roller, the fixing roller includes an elastic film inflatable by fluid injection, the mold roller is mounted or demounted when the elastic film is shrunken, and the mold roller is rotated by rotating the fixing roller when the mold roller is supported from the inside by inflating the elastic film, and the fixing roller includes bearings. The second fixing roller include the bearings, and so when being moved to an improper position on impact and the like, the mold roller can be rotated under no power supply through the fixing roller, and back to the proper position as quickly as possible. Further, the use of the bearings can prevent misalignment between the mold roller and the fixing roller in the rotation axis direction.

According to the fixing roller for use in the roller nanoimprint apparatus of the present invention, the elastic film may be a component of the fixing roller or may be a component independent form the fixing roller.

The present invention is also preferably a method of producing a nanoimprint sheet using the first nanoimprinter of the present invention, specifically, a production method of a nanoimprint sheet having nanosized protrusions formed on a surface thereof, wherein a cylindrical mold roller and a fluid container are used, the cylindrical mold roller having nanosized recesses formed on an outer circumference surface thereof, the fluid container arranged in a region defined by an inner circumference surface of the mold roller and including an elastic film inflatable by fluid injected into the container, the mold roller is mounted or demounted when the elastic film is shrunken, the mold roller is supported from the inside when the elastic film is inflated, and embossing to a workpiece film is continuously performed by rotating the mold roller (hereinafter, also referred to as a first sheet production method of the present invention). According to the first sheet production method of the present invention, a nanoimprint sheet with a uniform thickness can be produced at low costs. The nanoimprint sheet is not especially limited as long as it has a surface with nanosized protrusions formed thereon, and a resin sheet is preferable, for example. The nanoimprint sheet can be preferably used as an anti-reflection film, for example. This production method may be a method in which embossing to the nanoimprint sheet is continuously performed by rotating the mold roller.

The inventors also found that the resulting film with nanostructures having been transferred from the mold roller can be prevented from being uneven in thickness and the mold roller can be easily replaced when the mold roller is rotated while being supported by at least three pinch rollers (supporting rollers) that are arranged substantially rotation-symmetrically with respect to the rotation center (rotation axis) of the mold roller. The present invention is also a roller nanoimprint apparatus continuously transferring nanosized protrusions to a surface of a workpiece film by rotating a mold roller, wherein the mold roller is a cylindrical body having nanosized recesses formed on an outer circumference surface thereof, and the nanoimprint apparatus is configured to rotate the mold roller while supporting the mold roller by at least three pinch rollers arranged substantially rotation-symmetrically with respect to a rotation center of the mold roller (hereinafter, also referred to as a second nanoimprinter of the present invention). The second nanoimprinter excludes a fixing roller, and so the mold roller can be easily replaced.

According to the second nanoimprinter of the present invention, the pinch rollers are rotated while each holding the workpiece film from both sides (both major surface sides) thereof together with the mold roller by a certain pressure, thereby rotating the mold roller to push the workpiece film forward. Thus, by arranging at least three pinch rollers substantially rotation-symmetrically, the mold roller can be stably supported by only the pitch rollers.

Similarly to the first nanoimprinter of the present invention, in the second nanoimprinter of the present invention, it is preferable that the mold roller substantially has no seam. It is also referable that the mold roller is an aluminum tube having the nanosized recesses formed on a polished outer circumference surface thereof by anodization.

The second mold roller of the present invention and the second fixing roller of the present invention are preferably used in the second nanoimprinter of the present invention.

The present invention is also directed to a production method of a nanoimprint sheet using the second nanoimprinter of the present invention. One aspect of the present invention is to provide a production method of a nanoimprint sheet having nanosized protrusions formed on a surface thereof, wherein a cylindrical mold roller and at least three pinch rollers are used, the cylindrical mold roller having nanosized recesses formed on an outer circumference surface thereof, the at least three pinch rollers arranged substantially rotation-symmetrically with respect to a rotation center of the mold roller, the mold roller is supported by the at least three pinch rollers, and embossing to a workpiece film is continuously performed by rotating the mold roller and the at least three pinch rollers (hereinafter, also referred to as a second sheet production method of the present invention). According to the second sheet production method of the present invention, a nanoimprint sheet with a uniform thickness can be produced at low costs. This production method may be a method in which embossing to the nanoimprint sheet is continuously performed while the mold roller and the at least three pinch rollers are rotated.

EFFECT OF THE INVENTION

According to the roller nanoimprint apparatus of the present invention, it is possible to prevent a workpiece film with nanostructures having been transferred from the mold roller from being uneven in thickness, and the mold roller can be easily replaced.

BEST MODES FOR CARRYING OUT THE INVENTION

The present invention is mentioned in more detail below with reference to Embodiments, but not limited only thereto.

Embodiment 1

FIG. 1 is an explanation view for showing the entire configuration of a roller nanoimprint apparatus of Embodiment 1.

According to the roller nanoimprint apparatus of Embodiment 1, first, a base film roll 11 is rotated to feed a belt-like base film 12 in the direction shown by the arrow in FIG. 1. Then the base film 12 passes through a pair of pinch rollers 13a and 13b for tension adjustment and then, an uncured resin is coated thereon by a die coater 14. The base film 12 moves halfway around a cylindrical mold roller 15 along its outer circumference surface. At this time, the resin on the base film 12 is in contact with the outer circumference surface of the mold roller 15.

The material of the base film 12 is not especially limited, and examples thereof include triacetyl cellulose (TAC) and polyethylene terephthalate (PET). The resin is preferably a resin curable by energy beam, e.g., electromagnetic waves such as UV rays and visible light. A UV-curable resin is used in the present Embodiment.

The mold roller 15 is a cylindrical body having an outer circumference surface on which a plurality of cavities with a substantially conical shape with about 200 nm in depth (the bottom of the cone is on an aluminum surface side) is formed. The cylindrical body has 250 mm in inner diameter, 260 mm in outer diameter, and 400 mm in length. Such a mold roller 15 can be prepared by cut-polishing an outer circumference surface of a cylindrical aluminum tube formed by extruding, and alternately repeating three times etching and anodization for the cut-polished flat (outer circumference) surface. The mold roller 15 has seamless nanostructures because the etching and the anodization are simultaneously performed for the outer circumference of the tube. Thus the seamless nanostructures can be continuously imprinted into the UV-curable resin.

A cylindrical pinch roller 16 is arranged to face the outer circumference surface of the mold roller 15 at the position where the base film 12 is firstly in contact with the outer circumference surface of the mold roller 15. At this position, the pinch roller 16 presses the UV-curable resin against the mold roller 15, and as a result, the UV-curable resin is embossed with the surface shape of the mold roller 15. The base film 12 has a width smaller than the length of the rollers 15 and 16 so that the rollers 15 and 16 uniformly sandwich the base film 12. The pinch roller 16 is a rubber roller.

While the base film 12 travels along the outer circumference surface of the mold roller 15, the resin is irradiated with UV rays from the bottom side of the roller 15. As a result, cured is the UV-curable resin having a surface with nanosized protrusions and recesses in the inverse shape to the surface shape of the mold roller 15. The white arrow in FIG. 1 is a direction of the UV-irradiation.

After moving halfway along the outer circumference surface of the mold roller 15, the base film 12 moves along a pinch roller 17 arranged to face the outer circumference surface of the mold roller 15 and then is separated from the roller 15 together with the cured resin. Then, a pinch roller 20 attaches a lamination film 19 fed from a lamination film roll 18 to the resin film side-surface of the base film 12. Finally, a lamination composed of the base film 12, the cured film with the nanostructures, and the lamination film 19 is rolled up to obtain a lamination roll 21. The lamination film 19 can protect the resin film surface against dust and damages.

The resin film (workpiece film) 31 of the thus-obtained lamination roll 21 has a surface on which substantially conical protrusions 32 with about 200 nm in height are formed so that a distance between peaks of adjacent ones of the protrusions is about 200 nm as shown in FIG. 2. The surface structures are commonly called "moth-eye structure(s)". Films with moth-eye structures are known as ultra-low reflective films having a reflectance for visible light of about 0.15%, for example. The moth-eye structures are protrusions smaller than a wavelength of visible light (380 nm to 780 nm), and due to these protrusions, the refractive index of the interface is considered to continuously and gradually increase from 1.0 of the refractive index of air on the film surface to a value equivalent to the reflective index of the film material (1.5 in the resin film 31). As a result, no refractive-index interface substantially exists, and the reflectance on the film interface is sharply decreased.

The mold roller 15 shown in FIG. 4(*a*) is mounted on the nanoimprint apparatus with a metal fixing roller 151 and a rubber balloon 156 shown in FIG. 4(*b*). According to the present Embodiment, the mold is prepared by forming nanostructures on a metal tube surface, and so the mold with a simple structure can be produced at low costs, as compared with the case where a metal column directly mounted on the nanoimprint apparatus is used as the mold. Mirrored aluminum tubes produced by high-accurately cutting a surface of a cylindrical aluminum tube prepared by extrusion are available as the polished aluminum tube at low costs. The mold roller 15 is removably fixed to the fixing roller 151, and this allows replacement and maintenance of only the mold roller 15, leading to a reduction in running costs of the nanoimprint apparatus.

FIG. 5 is a perspective view schematically showing a state where the fixing roller has been arranged inside the mold roller tube. FIG. 6 is a cross-sectional view schematically showing a state where the fixing roller has been arranged inside the mold roller (when the mold roller is mounted or demounted). FIG. 7 is a cross-sectional view schematically showing a state where the fixing roller has been arranged inside the mold roller tube (when the mold roller is fixed to the fixing roller). The fixing roller 151 is composed of a hollow body 151*a* including the rubber balloon 156 thereinside and a shaft 151*b* extending from the respective ends of the body 151*a*. The body 151*a* has a cylindrical shape and the both ends thereof are constituted by a wall surface. The body 151*a* has openings each extending in the rotation axis direction of the fixing roller 151, i.e., in parallel to the extending direction of the shaft 151*b*. The openings of the body 151*a* are preferably arranged in parallel to the rotation axis direction of the fixing roller 151 so that a uniform pressure is given to the resin. From the same reason, it is also preferable that the openings are the same in size and uniformly spaced. It is preferable that the openings do not have an angular shape so as to avoid damages against the rubber balloon 156. The hollow body 151*a* has 246 mm in outer diameter and 400 mm in length. The shaft 151*b* is inserted into a shaft-mounting portion of the nanoimprint apparatus. The fixing roller 151 can be rotated around the extending direction of the shaft 151*b* by power supplied through the shaft-mounting portion.

The rubber balloon 156, which is arranged inside the body 151*a* of the fixing roller 151, fixes the mold roller 15. The cylindrical mold roller 15 cover the body 151*a* of the fixing roller 151 by inserting the fixing roller 151 thereinto. When this mold roller 15 is mounted, the rubber balloon 156 is shrunken as shown in FIG. 6. Similarly, also when the mold roller 15 is demounted, the rubber balloon 156 is shrunken. For fixing the mold roller 15, fluid is injected through a pressure port 256 into the rubber balloon 156, and as shown in FIG. 7, the rubber balloon 156 is inflated until it protrudes from the openings of the body 151*a* of the fixing roller 151 to be pressed against the inner circumference surface of the mold roller 15. In the present Embodiment, the fixing roller 151 is a hollow roller, and the rubber balloon 156 is an elastic bag. Examples of the fluid for inflating the rubber balloon 156 include gases such as air, and liquids such as water.

The pressure port 256 has a symmetrical shape with respect to the rotation axis in order to give a uniform pressure to the mold roller 15. It is preferable that the pressure port 256 is arranged near the rotation axis or a plurality of the pressure ports 256 are arranged symmetrically with respect to the rotation axis in order to give a uniform pressure to the mold roller 15.

According to the fixing way of the mold roller 15 of the present invention, the fluid inside the rubber balloon 156 uniformly applies a pressure to the inner circumference surface of the mold roller 15. So when the base film 12 with being sandwiched between the mold roller 15 and the pinch roller 16 is embossed with the nanostructures, the resin on the base film 12 can be uniformly pressed, and as a result, uneven thickness of the resin film 31 can be prevented. The thickness of the resin film 31 prepared in the present Embodiment was measured to be 10±0.7 µm, which shows the resin film 31 has excellent in thickness uniformity. The resulting resin film 31 was attached on a flat surface of a black acrylic plate (refractive index: 1.49) with a paste (refractive index: 1.50). This film was observed by the naked eye from various directions under white light. Neither thickness unevenness nor accompanying display unevenness was determined. Such a resin film 31 is preferably attached, as an anti-reflection film, to display screens of display devices, display windows such as show windows, or decorated surfaces of building materials. Examples of the display devices include LCDs, organic EL displays, and plasma displays.

According to this way of fixing the mold roller 15 of the present Embodiment, the mold roller 15 can be easily fixed by the fluid injection and also can be easily released by the fluid discharge.

According to the present Embodiment, as shown in FIG. 8, a rubber plate 251, which is an elastic body, may be attached to the outer circumference surface of the body 151a of the fixing roller 151, except for in the openings. The rubber plate 251 functions as a stopper (buffer) for preventing contact between the fixing roller 151 and the mold roller 15. Owing to the rubber plate 251, the contact between the fixing roller 151 and the mold roller 15 can be prevented when the nanostructures are transferred. As a result, the resin film 31 can show a uniform thickness and the fixing roller 151 and the mold roller 15 can be protected against damages. The rubber plate 251 has a thickness of 0.5 mm, for example. The rubber plate 251 may be arranged on the inner circumference surface of the mold roller 15 or on the rubber balloon 156 surface at the portions protruding from the outer circumference surface of the body 151a of the fixing roller 151 although being arranged on the outer circumference surface of the body 151a of the fixing roller 151 in this Embodiment. The elastic body is not especially limited as long as it can reduce impacts. Springs may be used instead of the rubber plate 251.

The following configuration shown in FIG. 9 may be employed. Linear projections 151c are formed on an outer circumference surface of the body of the fixing roller 151 and further linear grooves 15c are formed on the inner circumference surface of the mold roller 15 so that the location of the projections 151c corresponds to the location of the grooves 15c when the fixing roller 151 is arranged inside the mold roller 15. The linear projections 151c are high enough to engage with the linear grooves 15c with a space therebetween when the fixing roller 151 is arranged inside the mold roller 15. When the mold roller 15 is fixed to the fixing roller 151, the projections 151c and the grooves 15c are loosely engaged with each other, and thereby the mold roller 15 can be roughly positioned with the fixing roller 151. Then, by inflating the rubber balloon 156, the fixing roller 151 can support the mold roller 15 with high accuracy. Thus, for example, when a large resin film 31 is produced using a large mold roller 15 with 1 meter or larger of a length in the rotation axis direction, the mold roller 15 can be easily mounted or demounted.

According to the example shown in FIG. 9(a), four linear projections 151c are formed on the outer circumference surface of the body of the fixing roller 151. According to the example shown in FIG. 9(b), four linear grooves 15c are formed on the inner circumference surface of the mold roller 15. The number of the engaged structures each composed of a pair of the projection 151c and the groove 15c is not especially limited.

The shape and location of the engaged structures are not especially limited. As shown in FIG. 9, the linear projections 151c and the linear grooves 15c extending in the rotating axis directions of the rollers 15 and 151 respectively may be arranged only at the end of the rollers. Alternatively, linear projections and linear grooves extending from one end to the other of the rollers 15 and 151 respectively may be arranged. The linear projections 151c and the linear grooves 15c in FIG. 9 can prevent sliding possibly occurring between the two rollers 15 and 151 in the circumferential direction (rotating direction). The engaged structures extending in the circumferential direction of the rollers can prevent misalignment between the rollers in the rotation axis direction. Further, when the engaged structures are composed of planar patterns extending both in the rotation axis direction and in the circumferential direction of the rollers, the sliding in the circumferential direction of the rollers, and the misalignment between the rollers in the rotation axis direction can be both prevented.

The engaged structures may be composed of linear grooves formed on the outer circumference surface of the fixing roller 151 and linear projections formed on the inner circumference surface of the mold roller 15. Instead of the engaged structures composed of pairs of linear projections and linear grooves, engaged structures composed of three or more linear projections may be employed. For example, used may be an embodiment in which two linear projections parallel to each other are formed on the outer circumference surface of the fixing roller 151 and one linear projection is formed on the inner circumference surface of the mold roller 15, and the linear projection on the mold roller 15 is positioned between the two projections on the fixing roller 151.

As shown in FIG. 10, the shaft of the fixing roller 151 may be equipped with bearings 151d. The bearings 151d allow the mold roller 15, which is compulsorily rotated by power of the nanoimprint apparatus normally, to be freely rotated (under no power supply through the fixing roller 151) when the mold roller 15 is shifted from the proper position by impacts and the like. As a result, the mold roller 15 can be back to the proper position as quickly as possible.

Embodiment 2

FIG. 11 is a cross-sectional view schematically showing a state where a fixing roller has been arranged inside a mold roller tube (when the mold roller is mounted or demounted). FIG. 12 is a cross-sectional view schematically showing a state where a fixing roller has been arranged inside the mold roller tube (when the mold roller is fixed). The roller nanoimprint apparatus of Embodiment 2 has the same structure as in the roller nanoimprint apparatus of Embodiment 1, except for the fixing roller. According to a fixing roller 152 of the present Embodiment, openings of a hollow body 152a are sealed with a rubber plate (rubber sheet) 157, and thus the whole of the inside of the body 152a of the fixing roller 152 constitutes a fluid container. Specifically, according to the present Embodiment, the fixing roller 152 is a hollow roller, and the rubber plate 157 is an elastic film. According to this Embodiment, the fixing roller 152 itself is used as a container for pressurization, and so a pressure port 257 is directly provided for the fixing roller to be directly connected to a fluid injection portion of the roller nanoimprint apparatus. As a result, the strength of the fluid passage itself and the connection portion can be increased. A specific structure of the fixing roller of the present Embodiment is mentioned below.

The fixing roller 152 of the present Embodiment is composed of a hollow body 152a and a shaft 152b extending from the respective ends of the body 152a. The body 152a is a cylindrical body and the both ends thereof are composed of a wall face. The body 152a has openings each extending in the rotation axis direction of the fixing roller 152, i.e., in parallel to the extending direction of the shaft 152b. According to the present Embodiment, the openings of the body 152a are sealed with a rubber plate 157. The openings of the fixing roller 152 are preferably formed in parallel to the rotation axis direction of the fixing roller 152 so as to give a uniform pressure against the resin. For the same reason, the openings are the same in size and uniformly spaced. The body 152a has 246 mm in an outer diameter and has 400 mm in a length. The shaft 152b is inserted into a shaft-mounting portion of the nanoimprint apparatus. The fixing roller 152 can be rotated round the extending direction of the shaft 152b by power supplied through the shaft-mounting portion.

The rubber plate 157 sealing the openings of the body 152a is arranged to fix the mold roller 15. The cylindrical mold roller 15 covers the body 152a of the fixing roller 152 by inserting the fixing roller 152 thereinto, as shown in FIG. 11. For fixing the mold roller 15, fluid is injected through a pressure port 257 into the mold roller 15, and as shown in FIG. 12, the rubber plate 257 is inflated until it protrudes from the openings of the body 152a of the fixing roller 152 to be pressed against the inner circumference surface of the mold roller 15. Examples of the fluid injected into the fixing roller 152 include gases such as air, and liquids such as water.

According to the fixing way of the mold roller 15 of the present invention, a uniform pressure is given by fluid to the inner circumference surface of the mold roller 15 through the rubber plate 157. So when the base film 12 with being sandwiched between the mold roller 15 and the pinch roller 16 is embossed with the nanostructures, the resin on the base film 12 can be uniformly pressed, and as a result, a variation in thickness of the resin film 31 can be prevented. The thickness of the resin film 31 prepared in the present Embodiment was measured to be 10±0.2 μm, which shows the resin film 31 has excellent in thickness uniformity. The resin film 31 was observed similarly to Embodiment 1, and neither thickness unevenness nor accompanying display unevenness was determined.

According to this way of fixing the mold roller 15 of the present Embodiment, the mold roller 15 can be easily fixed by the fluid injection and also can be easily released by the fluid discharge.

According to the present Embodiment, the rubber plate 157 is attached to the inner circumference surface of the fixing roller 152. This embodiment is advantageous in terms of bonding strength as compared with the embodiment where the rubber plate 157 is attached to the outer face side of the fixing roller 152. According to the present Embodiment, a rubber plate may be attached to the outer circumference surface of the body 152a of the fixing roller 152 as a stopper for preventing contact between the fixing roller 152 and the mold roller 15. In this case, this rubber plate as the stopper (buffer) and the rubber plate 157 arranged for supporting the mold roller 15 may be integrated with each other.

Embodiment 3

FIG. 13 is a perspective view schematically showing a structure of a fixing roller of Embodiment 3.

A fixing roller 153 of the present Embodiment includes a body on which circular openings with the same size are uniformly spaced. According to the present Embodiment, a rubber balloon may be arranged inside the fixing roller 153 as in Embodiment 1, and a rubber plate may be arranged to seal the openings of the fixing roller 153 as in Embodiment 2. The fixing roller of the present Embodiment may be used in the roller nanoimprint apparatus of Embodiment 1, instead of the fixing roller of Embodiment 1.

Embodiment 4

FIG. 14 is a perspective view schematically showing a structure of a fixing roller of Embodiment 4. FIG. 15 is a cross-sectional view schematically showing a state where a rubber tube has been wound around the fixing roller of Embodiment 4. A fixing roller 154 of the present invention is composed of a pair of circular plates 154a spaced from one another and a rotation shaft 154b equipped with the plates 154a. The fixing roller 154 including a rubber tube 259 wounded between the circular plates 154a of the rotation shaft 154b is arranged inside the mold roller 15 tube. Also according to the present Embodiment, the mold roller 15 is supported from the inside when the rubber tube 259 is inflated, and the mold roller 15 can be mounted or demounted when the rubber tube 259 is shrunken. Specifically, according to the present Embodiment, the fixing roller 154 is a rotor, and the rubber tube 259 is an elastic bag. The fixing roller of the present Embodiment may be used in the roller nanoimprint apparatus of Embodiment 1, instead of the fixing roller of Embodiment 1.

According to the present Embodiment, a rubber plate, which is an elastic body, may be attached to the outer circumference surface of the circular plate 154a of the fixing roller 154. The rubber plate functions as a stopper (buffer) for preventing contact between the fixing roller 154 and the mold roller 15. Owing to the rubber plate, the contact between the fixing roller 154 and the mold roller 15 can be prevented when the nanostructures are transferred. As a result, the resin film 31 can show a uniform thickness and the fixing roller 154 and the mold roller 15 can be protected against damages. The rubber plate has a thickness of 0.5 mm, for example. The rubber plate may be arranged on the inner circumference surface of the mold roller 15 in the present Embodiment. The elastic body is not especially limited as long as it can reduce impacts. Springs may be used instead of the rubber plate.

Embodiment 5

FIG. 16 is an explanation view showing the entire configuration of a roller nanoimprint apparatus of Embodiment 5.

According to the present Embodiment, a fixing roller is not mounted, and a mold roller 25 is supported only by first to third pinch rollers 26, 27, and 28 arranged rotation-symmetrically (spaced at 120°) with respect to the rotation center of the mold roller 25. By rotating the pinch rollers 26, 27, and 28, the mold roller 25 is rotated and pushes the base film 12 forward.

The first and third pinch rollers 26 and 27 are the same as those arranged in the roller nanoimprint apparatus of Embodiment 1. The first pinch roller 26 is arranged for transferring the nanostructures onto the resin on the base film 12. The third pinch roller 27 is arranged for separating the resin on the base film 12 from the mold roller 15. The second pinch roller 28 is arranged for stabilize the location of the mold roller 25.

In the present Embodiment, it is preferable that the first to third pinch rollers 26 to 28 uniformly press the mold roller 25. For example, pressure cylinders of the pinch rollers 26 to 28 have the same structure, and the rollers 26 to 28 press the roller 25 by the same fluid pressure (by the same system).

According to the present Embodiment, the three pinch rollers 26 to 28 are arranged rotation-symmetrically with respect to the rotation center of the mold roller 25, and the resin is irradiated with UV rays twice, one time between the first and second pinch rollers 26 and 28, the other time between the second and third pinch rollers 28 and 27. The white arrow in FIG. 16 shows a direction of the UV irradiation.

The number of the pinch rollers may be four or larger as long as they are arranged rotation-symmetrically so that the mold roller 25 is not eccentrically supported. When the fixing roller is not arranged and when the mold roller 25 is supported by only two pinch rollers as shown in FIG. 1, the mold roller 25 is pushed from the base film 12 toward the upper direction and can not be stably rotated.

When the mold roller is supported by the three or more pinch rollers as in the present Embodiment, the mold roller can be supported without the fixing roller. Thus when the fixing roller is not used, a slide-preventing mechanism is preferably arranged to prevent the mold roller from sliding in the rotation axis direction when the nanostructures are transferred, and for example, a stopper 181 shown in FIG. 17 may be used. If the fixing roller is used, the mold roller 25 can be rotated by rotating the pinch rollers 26 to 28, and so there is no need to convey rotation power from the fixing roller to the mold roller 25. Thus, it is preferable that the fixing roller is equipped with the bearings, and the fixing roller is mounted on the roller nanoimprint apparatus through the bearings.

Although the roller nanoimprint apparatuses of Embodiments 1 to 5 perform a series of processes from feeding of the base film 12 to take-up thereof, the roller nanoimprint apparatus of the present invention may be composed of only a mechanical unit for supporting and rotating the mold roller, such as the fixing roller and the rubber balloon, and a mechanical unit for embossing such as the pinch roller and the mold roller.

Comparative Embodiment 1

A roller nanoimprint apparatus of Comparative Embodiment 1 has the same configuration as in Embodiment 1, except for the fixing roller. According to this Comparative Embodiment, a metal roller is inserted into the same mold roller as in Embodiment 1, and a spacer (wedge) is arranged inside a space between the two rollers, and further the two rollers are attached to each other by curing a resin injected into the space. The mold roller is mounted on a roller nanoimprint apparatus, and a resin film with moth-eye structures is produced. The thickness of the resulting resin film had 12±1.8 μm. The resin film was attached on a flat surface of a black acrylic plate (refractive index: 1.49) with a paste (refractive index: 1.50). This film was observed by the naked eye from various directions under white light. As a result, an interference color resulting from uneven thickness was observed.

The present application claims priority to Patent Application No. 2008-046667 filed in Japan on Feb. 27, 2008 under the Paris Convention and provisions of national law in a designated State, the entire contents of which are hereby incorporated by reference.

BRIEF DESCRIPTION OF DRAWINGS

In FIG. 18, the hatched region shows a region where the pattern is formed.

EXPLANATION OF NUMERALS AND SYMBOLS

Figure 1:
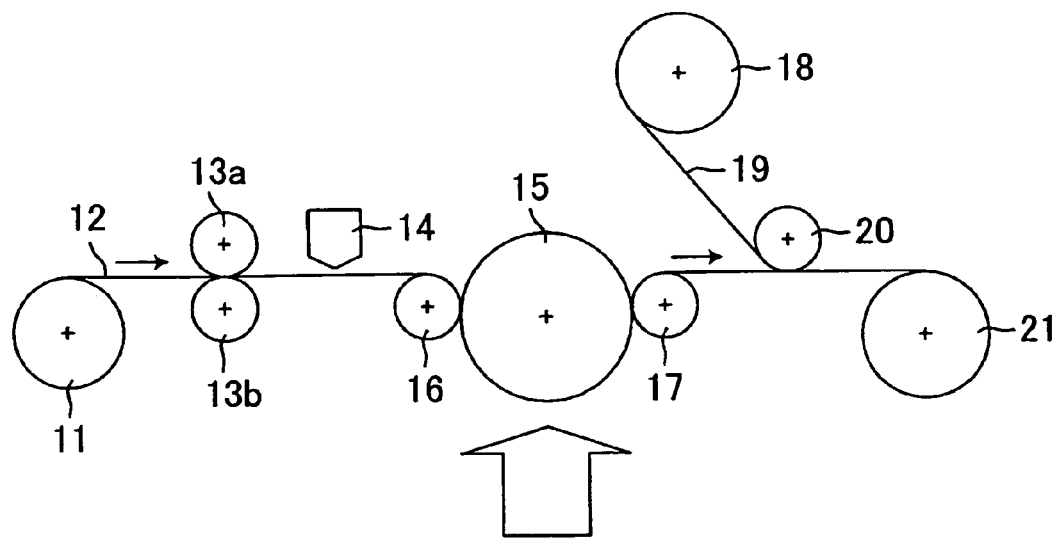
FIG. 1 is an explanation view showing the entire configuration of a roller nanoimprint apparatus of Embodiment 1.
Figure 2:
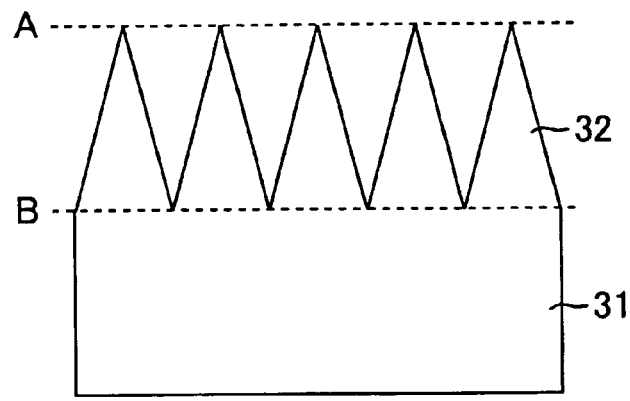
FIG. 2 is a cross-sectional view schematically showing surface structures of a resin film produced in Embodiment 1.
Figure 3:
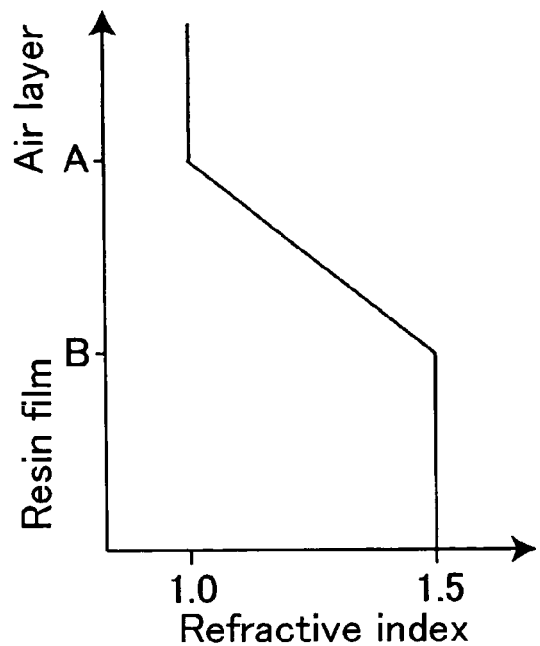
FIG. 3 is an explanation view showing a change of refractive index of an interface between the surface structures of a resin shown in FIG. 2 and an air layer.
Figure 4:
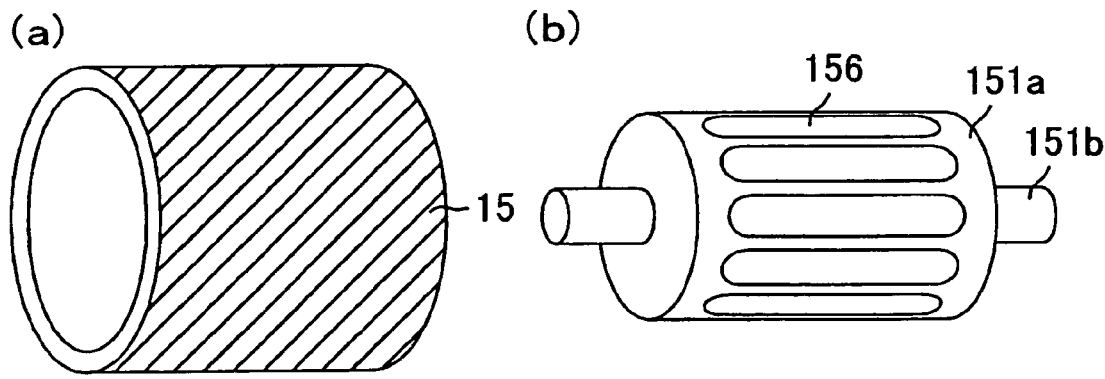
FIG. 4(a) is a perspective view schematically showing a configuration of the mold roller of Embodiment 1.
FIG. 4(b) is a perspective view schematically showing a configuration of a fixing roller in Embodiment 1.
Figure 5:
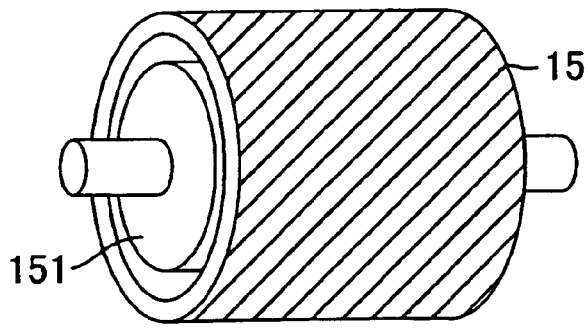
FIG. 5 is a perspective view schematically showing a state where the fixing roller has been arranged inside the mold roller tube in Embodiment 1.
Figure 6:
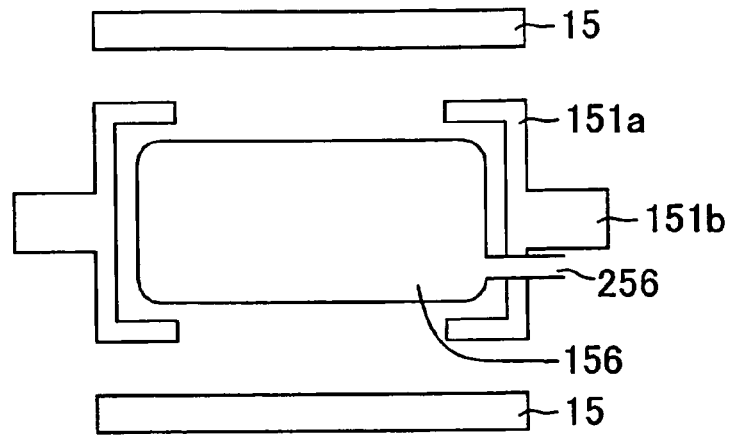
FIG. 6 is a cross-sectional view schematically showing a state where the fixing roller has been arranged inside the mold roller tube (when the mold roller is detached) in Embodiment 1.
Figure 7:
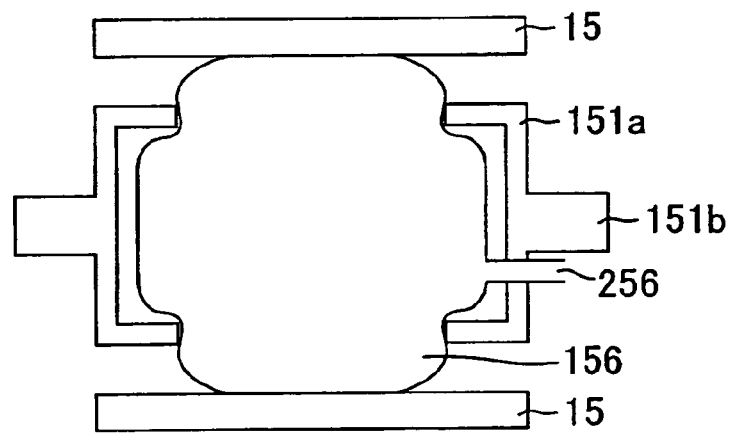
FIG. 7 is a cross-sectional view schematically showing a state where the fixing roller has been arranged inside the mold roller tube (when the mold roller is fixed) in Embodiment 1.
Figure 8:
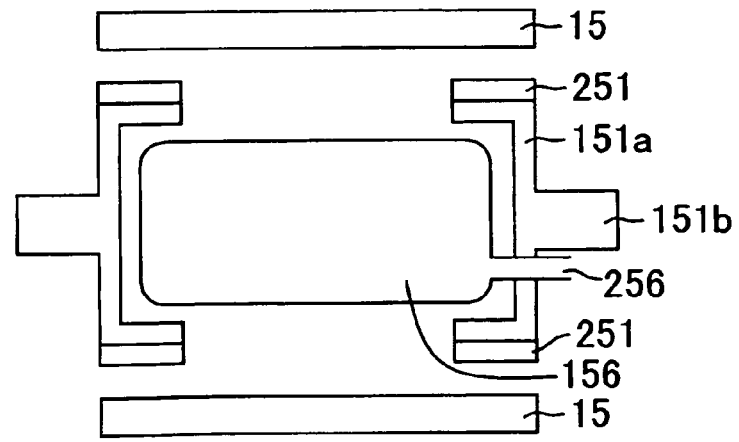
FIG. 8 is a cross-sectional view schematically showing one example of an embodiment in which a rubber plate is attached to the outer circumference surface of a body of the fixing roller in Embodiment 1.
Figure 9:
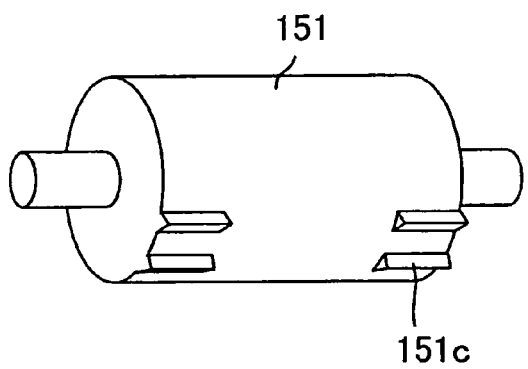
FIG. 9(a) is a perspective view schematically showing one example of a fixing roller including a body having linear projections formed on the outer face thereof.
FIG. 9(b) is a perspective view schematically showing one example of a mold roller having linear grooves formed on the inner circumference surface thereof.
Figure 9:
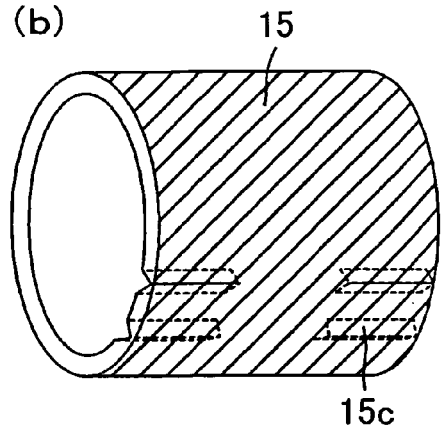
Figure 10:
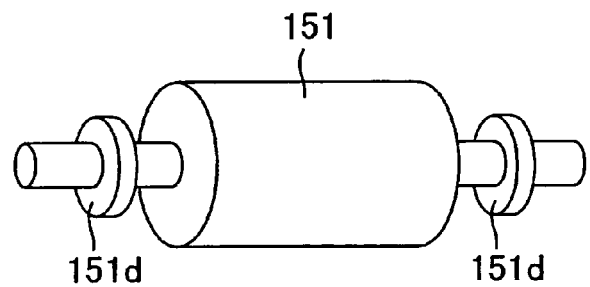
FIG. 10 is a perspective view schematically showing one example of a fixing roller including bearings attached to a shaft (Embodiment 1).
Figure 11:
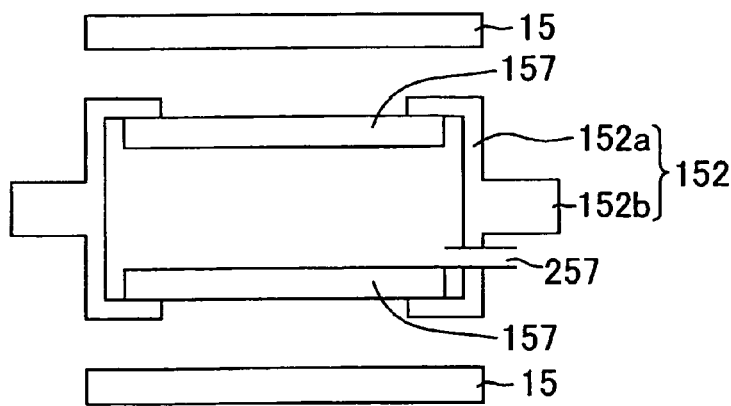
FIG. 11 is a cross-sectional view schematically showing a state where a fixing roller has been arranged inside a mold roller tube (when the mold roller is detached) of Embodiment 2.
Figure 12:
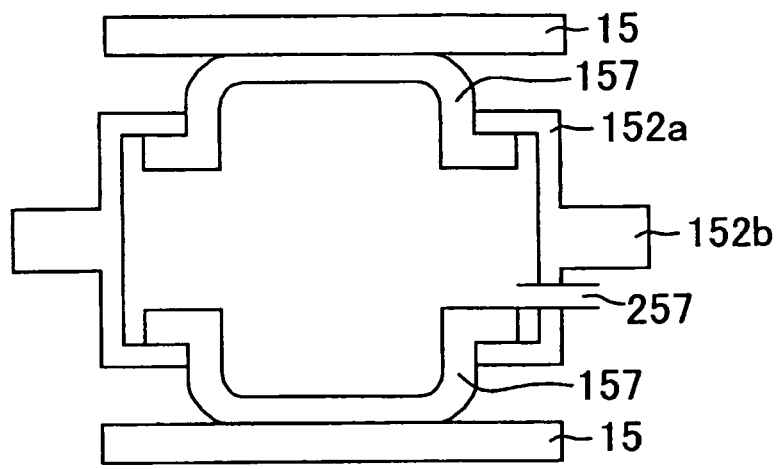
FIG. 12 is a cross-sectional view schematically showing a state where the fixing roller has been arranged inside the mold roller tube (when the mold roller is fixed) of Embodiment 2.
Figure 13:
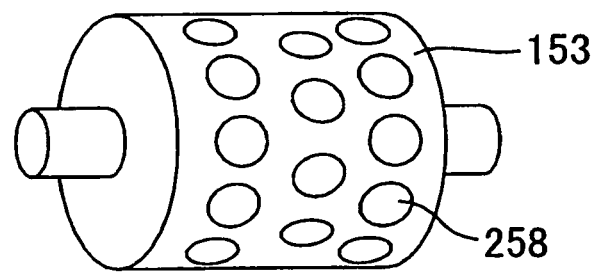
FIG. 13 is a perspective view schematically showing a structure of a fixing roller of Embodiment 3.
Figure 14:
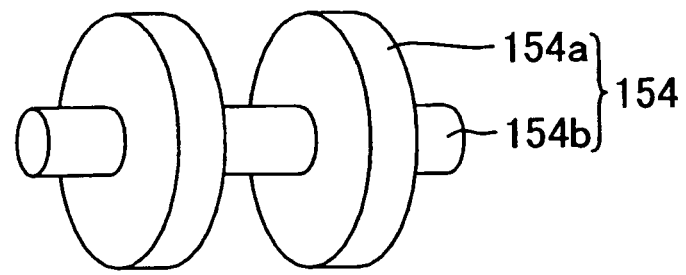
FIG. 14 is a perspective view schematically showing a structure of a fixing roller of Embodiment 4.
Figure 15:
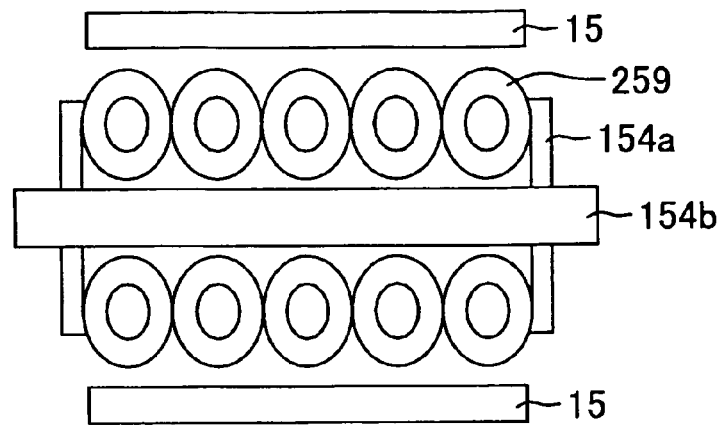
FIG. 15 is a cross-sectional view schematically showing a state where a rubber tube is wound around the fixing roller of Embodiment 4.
Figure 16:
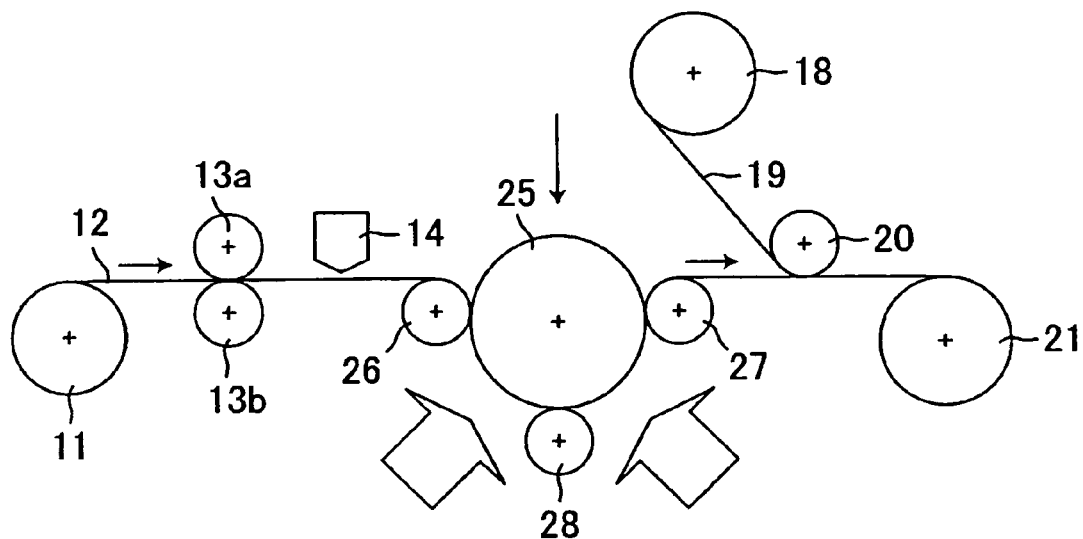
FIG. 16 is an explanation view showing the entire configuration of a roller nanoimprint apparatus of Embodiment 5.
Figure 17:
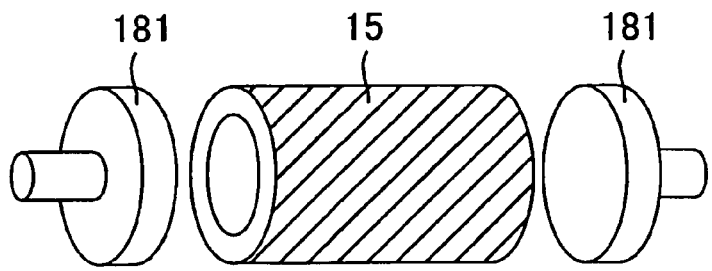
FIG. 17 is a perspective exploded view schematically showing one example of an embodiment in which stoppers are arranged on the respective side surfaces of a mold roller as an anti-slide mechanism in Embodiment 5.
Figure 18:
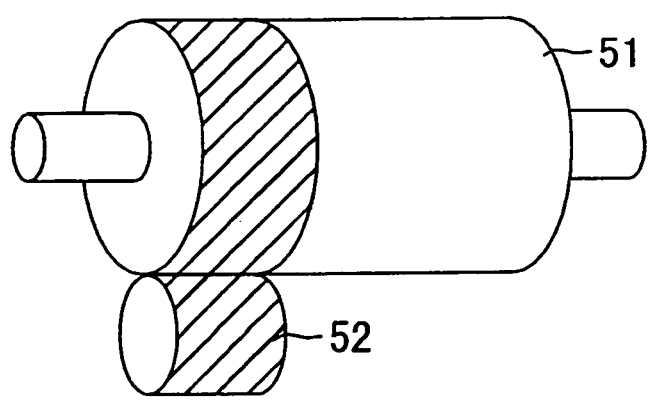
FIG. 18 is a schematic view showing a way of transferring a mold pattern from a small mold roller to a UV-curable resin on a large mold roller.

11: Base film roll
12: Base film
13a, 13b, 16, 17, 20, 26, 27, 28: Pinch roller
14: Die coater
15, 25: Mold roller
15c: Linear groove
18: Lamination film roll
19: Lamination film
21: Lamination roll 31: Resin film
32: Protrusion
51: Mold roller (large)
52: Mold roller (small)
151, 152, 153, 154: Fixing roller
151a, 152a: Body
151b, 152b: Shaft
151c: Linear projection
151d: Bearing
154a: Circular plate
154b: Rotation shaft
156: Rubber balloon
157, 251: Rubber plate
181: Stopper
256, 257: Pressure port
258: Elastic film
259: Rubber tube

The invention claimed is:

1. A roller nanoimprint apparatus continuously transferring nanosized protrusions to a surface of a workpiece film by rotating a mold roller, the apparatus comprising:
  a mold roller including a cylindrical body having an outer circumference surface with nanosized recesses formed thereon,
  a fluid container having an elastic film inflatable by injecting fluid into the fluid container, the fluid container being arranged in a region defined by an inner circumference surface of the mold roller, wherein
  the mold roller is mounted on the fluid container and demounted from the fluid container when the elastic film is shrunken,
  the mold roller is supported from the inside when the elastic film is inflated,
  the mold roller includes a first engaged structure on the inner circumference surface,
  the fluid container includes a second engaged structure on an outer circumference surface, and
  the first and second engaged structures consist of a pair of a liner projection and a linear groove or a pair of linear projections, and engage with each other.

2. The roller nanoimprint apparatus according to claim 1, wherein the mold roller substantially has no seam.

3. The roller nanoimprint apparatus according to claim 1, wherein the mold roller is an aluminum tube having the nanosized recesses formed on a polished outer circumference surface thereof by anodization.

4. The roller nanoimprint apparatus according to claim 1, wherein the mold roller is prepared by cut-polishing an outer circumference surface of a cylindrical aluminum tube formed by extruding, and alternately repeating etching and anodization for the cut-polished outer circumference surface, thereby forming conical recesses with a depth smaller than a wavelength of visible light on the outer circumference of the mold roller.

5. The roller nanoimprint apparatus according to claim 1, wherein the mold roller is rotated by rotating a fixing roller when the mold roller is supported from the inside by inflating the elastic film, and
  the fluid container includes bearings.

6. A production method of a nanoimprint sheet having nanosized protrusions formed on a surface thereof, the method comprising:
  providing a cylindrical mold roller and a fluid container, the cylindrical mold roller having nanosized recesses formed on an outer circumference surface thereof,
  the fluid container arranged in a region defined by an inner circumference surface of the mold roller and including an elastic film inflatable by fluid injected into the fluid container,
  at least one of mounting the mold roller on the fluid container and demounting the mold roller from the fluid container when the elastic film is shrunken,
  supporting the mold roller from the inside when the elastic film is inflated, and
  embossing a workpiece film by rotating the mold roller, wherein
  the mold roller includes a first engaged structure on the inner circumference surface,
  the fluid container includes a second engaged structure on an outer circumference surface thereof, and
  the first and the second structures consist of a pair of a liner projection and a linear groove or a pair of linear projections, and engage with each other.

* * * * *